United States Patent [19]

Kang

[11] Patent Number: 5,386,266
[45] Date of Patent: Jan. 31, 1995

[54] PROJECTION EXPOSURE SYSTEM

[75] Inventor: Ho-young Kang, Suwon, Rep. of Korea

[73] Assignee: Samsung Electronics Co., Ltd., Suwon, Rep. of Korea

[21] Appl. No.: 155,003

[22] Filed: Nov. 22, 1993

[30] Foreign Application Priority Data

Nov. 21, 1992 [KR] Rep. of Korea .................. 21977/92

[51] Int. Cl.6 ............................................. G03B 27/54
[52] U.S. Cl. ........................................ 355/67; 355/53
[58] Field of Search .......................... 355/53, 67, 71; 362/268

[56] References Cited

U.S. PATENT DOCUMENTS

| | | | |
|---|---|---|---|
| Re. 34,634 | 6/1994 | Konno et al. | 362/268 |
| 4,497,015 | 1/1985 | Konno et al. | 362/268 |
| 4,619,508 | 10/1986 | Shibuya et al. | 353/122 |
| 4,789,222 | 12/1988 | Ota et al. | 350/167 |
| 4,939,630 | 7/1990 | Kikuchi et al. | 362/268 |
| 5,160,962 | 11/1992 | Miura et al. | 355/53 |
| 5,237,367 | 8/1993 | Kudo | 355/67 |
| 5,245,384 | 9/1993 | Mori | 355/67 |
| 5,296,892 | 3/1994 | Mori | 355/67 |
| 5,300,971 | 4/1994 | Kudo | 355/67 |
| 5,309,198 | 5/1994 | Nakagawa | 355/67 |
| 5,311,249 | 5/1994 | Kamon et al. | 355/71 |

*Primary Examiner*—Richard A. Wintercorn
*Attorney, Agent, or Firm*—Charles R. Donohoe; Robert A. Westerlund, Jr.; Stephen R. Whitt

[57] ABSTRACT

A projection exposure system includes a light source, a parallel-light forming lens and a fly's eyes lens which are sequentially disposed along a light traveling path. Between the parallel-light forming lens and fly's eyes lens is provided a light dispersing device which is composed of a first light dispersing lens with a concave lens or a second light dispersing lens with multiple small convex lenses. The light dispersing device diverges central light incident on the fly's eyes lens, to thereby increase peripheral light intensity. Accordingly, in tilted illumination, which uses peripheral light, light utilizing efficiency is raised.

4 Claims, 1 Drawing Sheet

PROJECTION EXPOSURE SYSTEM

BACKGROUND OF THE INVENTION

The present invention relates to a projection exposure system, and more particularly, to a modified illumination system for a projection exposure system.

Known projection exposing technology for forming fine patterns such as semiconductor devices include an excimer laser projection exposure system, a phase shift mask method, and a tilted illumination method. The tilted illumination method can improve resolution without adding new equipment, and therefore is widely used. Also, an annular illumination method using lenses with annular apertures can improve resolution by 15-20% and double depth of focus.

FIG. 1 illustrates schematically an illumination system for a conventional projection exposure system. Referring to FIG. 1, a reflecting mirror 2 is placed in front of light source 1. A parallel-light-forming lens 3 and a fly's eyes lens 4 are sequentially located along a light traveling path at the back of light source 1. In light emitted from light source 1 is reflected and converged by reflecting mirror 2, to be incident on parallel-light forming lens 3. Light which is nearly parallel is obtained from parallel-light forming lens 3 and focussed on fly's eyes lens 4. In a cross-section taken along line A—A, the light intensity just prior to incidence on fly's eyes lens 4 is great at the center and weak around the periphery. The light intensity is shown as plot (a) in FIG. 4.

However, when using annular illumination or tilted illumination, which utilize only peripheral light, since the amount of the peripheral light is small, the light utilizing efficiency is very low. Accordingly, the exposure time is lengthened, which thereby lowers productivity.

SUMMARY OF THE INVENTION

It is an object of the present invention to provide a projection exposure system for enhancing light utilizing efficiency of an illumination system.

To accomplish the above object, there is provided a projection exposure system including a light source, a parallel-light forming lens for forming parallel light, and a fly's eyes lens which receives the parallel light. A light dispersing device is placed between the parallel-light forming lens and fly's eyes lens along a light traveling path for diverging the centrally incident light toward the periphery of the fly's eyes lens. The light emitted from the fly's eyes lens illuminates a mask on which a predetermined pattern is formed.

In the projection exposure system of the present invention, since the central light is incident on the periphery of the fly's eyes lens because of the light dispersing device, a tilted illumination which uses only the peripheral light of the fly's eyes lens, is more efficiently utilized. Thus, because light is more efficiently used, exposing time is reduced to raise productivity.

BRIEF DESCRIPTION OF THE DRAWINGS

The above object and other advantages of the present invention will become more apparent by describing in detail a preferred embodiment thereof with reference to the attached drawings in which.

DETAILED DESCRIPTION OF THE PREFERRED EMBODIMENTS OF THE INVENTION

Figure 1:
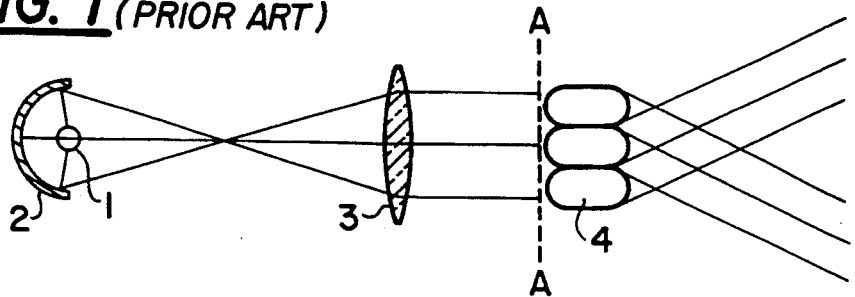
FIG. 1 is a schematic side view of a conventional projection exposure system.
Figure 2:
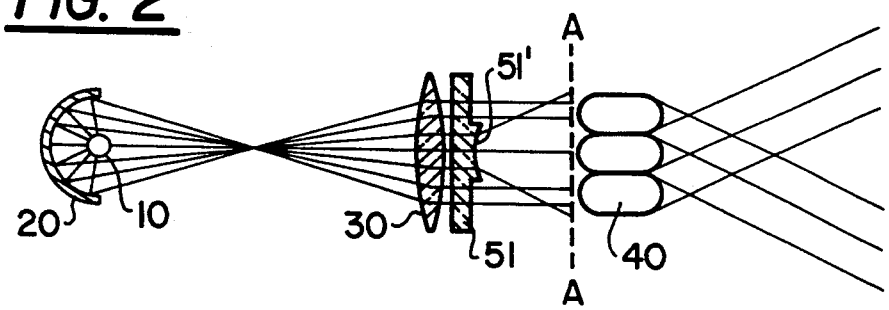
FIG. 2 is a schematic side view of a first embodiment of a projection exposure system according to the present invention.

Referring to FIG. 2 showing a first embodiment of the present invention, a light source 10, a reflecting mirror 20, a parallel-light forming lens 30 and a fly's eyes lens 40 are sequentially provided along a light traveling path. A first light dispersing lens 51 is placed between parallel-light forming lens 30 and fly's eyes lens 40.

The central portion of first light dispersing lens 51 is formed of a concave lens 51' so that the parallel light incident on the central portion diverges and becomes incident to the periphery of fly's eyes lens 40. For this purpose, concave lens 51' should be formed to have predetermined curvature and maintain a predetermined distance from fly's eyes lens 40.

The operation of the projection exposure system having such an illumination system constructed as above according to the present invention will be described hereinbelow.

The light emitted from light source 10 is reflected and converged by reflecting mirror 20 to become incident on parallel-light forming lens 30. The light passes through parallel-light forming lens 30 and then passes through first light dispersing lens 51 to become incident on fly's eyes lens 40. The light incident on the central portion of first light dispersing lens 51 is diverged by concave lens 51', and becomes incident to the periphery of fly's eyes lens 40. The light incident on the periphery of first light dispersing lens 51 is not refracted and also becomes incident to the periphery of fly's eyes lens 40 after passing through first light dispersing lens 51. The light emitted from fly's eyes lens 40 is used to illuminate tilted illumination, using a mask on which a predetermined pattern is formed. Accordingly, this pattern is therefore transferred from the mask to produce a semiconductor device, for example.

Figure 3:
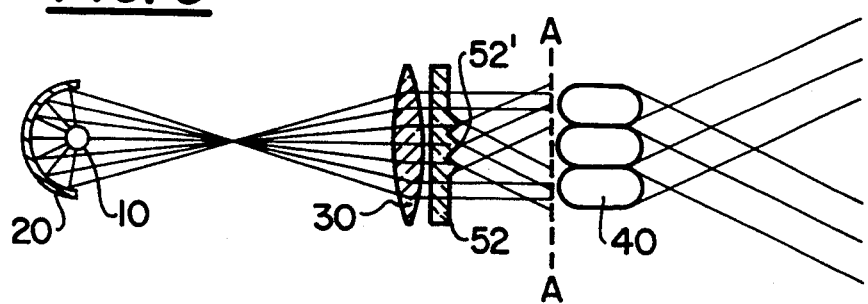
FIG. 3 is a schematic side view of a second embodiment of a projection exposure system according to the present invention.

In the second embodiment of the present invention of FIG. 3, a light source 10, a reflecting mirror 20, a parallel-light forming lens 30 and a fly's eyes lens 40 are sequentially provided along a light path in the same configuration as that of the first embodiment. A second light dispersing lens 52 is placed between parallel-light forming lens 30 and fly's eyes lens 40.

Second light dispersing lens 52 has a multitude of closely disposed small convex lenses 52' in the central portion, which constitute another fly's eyes lens. The second light dispersing lens 52 diverges the central light toward the periphery. The focal length of the convex lenses should be determined according to the size of the fly's eyes lens. For instance, if the diameter of fly's eyes lens 40 be 50 mm and the thickness is 5 mm, the focal length of the convex lenses should be around 10 mm.

Such convex lenses can be replaced with a zone plate, which is a diffraction lens used in the phase-shift method. The zone plate is manufactured using a photoresist, and is formed to alternately have annular pattern portions and etch portions which are concentric. The preferred type of zone plate is described in a U.S. patent application entitled "Illumination System for Projection Exposing Apparatus", which was filed on Nov. 23, 1993 by inventor Ho-young Kang, claiming priority on Korean application No. 92-22906, and this U.S. application is expressly incorporated by reference herein.

Operation of the second embodiment of the present invention as constructed above will now be explained.

The light from light source 10 passes through reflecting mirror 20 and parallel-light forming lens 30, to be incident on second light dispersing lens 52. Since second light dispersing lens 52 has a multitude of small convex lenses 52' in the central portion, the light incident to the convex lenses is first converged and then diverged to become incident on the periphery of fly's eyes lens 40. The light incident to the periphery of second light dispersing lens 52 passes through second light dispersing lens 52 without refraction and is incident to the periphery of fly's eyes lens 40. The light incident to the periphery of fly's eyes lens 40 is used to illuminate using tilted illumination, a mask on which a predetermined pattern is formed. Accordingly, this pattern is used in the manufacture of a semiconductor device or the like.

Figure 4:
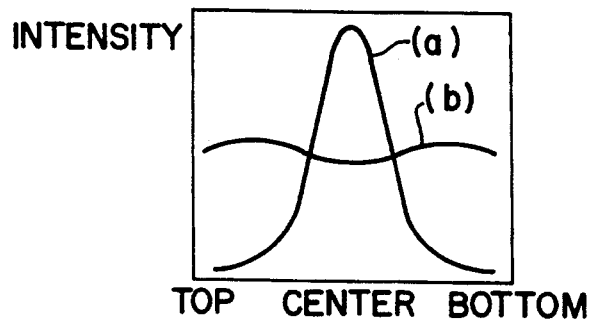
FIG. 4 is a graph showing light intensity at a cross section taken along line A—A of FIG. 1 (plot a) and the embodiments of FIGS. 2 and 3 (plot b).

As described above, in the projection exposure system according to the present invention, a light dispersing device is installed between a parallel-light forming lens and fly's eyes lens which are disposed on a light path, so that the light to be incident on the central portion of the fly's eyes lens via the parallel-light forming lens is diverged toward the periphery. Therefore, the light intensity just before the incidence on the fly's eyes lens light is more uniformly distributed on the central portion and periphery is shown at plot (b) in FIG. 4. Since the central light is dispersed around the periphery, when using tilted illumination that mainly uses peripheral light, the light utilizing efficiency is enhanced and exposing time is thereby reduced to improve productivity.

While the invention has been described in connection with what is presently considered to be the most practical and preferred embodiments, the invention is not limited to the disclosed embodiment but, on the contrary, is intended to cover various modifications and equivalents included within the spirit and scope of the following claims.

What is claimed is:

1. A projection exposure system comprising:
a light source for producing light;
a fly's eyes lens which receives light from said light source to illuminate a mask; and
a light dispersing lens placed between said light source and said fly's eyes lens along a light traveling path for diverging centrally incident light toward a periphery of said fly's eyes lens.

2. A projection exposure system comprising:
a light source for producing light;
a parallel-light forming lens for forming substantially parallel light from said light emitted from said light source;
a fly's eyes lens which receives said parallel light; and
a light dispersing element placed between said parallel-light forming lens and said fly's eyes lens on a light path of said parallel light for diverging centrally incident parallel light toward a periphery of said fly's eyes lens.

3. A projection exposure system according to claim 2, wherein said light dispersing element is a first light dispersing lens having a central portion comprising a concave lens.

4. A projection exposure system according to claim 2, wherein said light dispersing element is a second light dispersing lens having a central portion comprising a plurability of convex lenses.

* * * * *